United States Patent
Fuller et al.

(10) Patent No.: US 6,335,228 B1
(45) Date of Patent: Jan. 1, 2002

(54) METHOD FOR MAKING AN ANTI-FUSE

(75) Inventors: Robert T. Fuller, Mechanicsville; Frank Prein, Glen Allen, both of VA (US)

(73) Assignees: Infineon Technologies North America Corp., Cupertino, CA (US); White Oak Semiconductor Partnership, Sandstone, VA (US)

( * ) Notice: Subject to any disclaimer, the term of this patent is extended or adjusted under 35 U.S.C. 154(b) by 0 days.

(21) Appl. No.: 09/476,726

(22) Filed: Dec. 30, 1999

(51) Int. Cl.[7] .................................................. H01L 21/82
(52) U.S. Cl. ............................................ 438/131; 438/600
(58) Field of Search ................................. 438/130, 131, 438/600, 128, 132, 601; 148/DIG. 55; 257/530

(56) References Cited

U.S. PATENT DOCUMENTS

| | | | |
|---|---|---|---|
| 5,447,880 A | * | 9/1995 | Lee et al. ....................... 438/600 |
| 5,527,745 A | * | 6/1996 | Dixit et al. ..................... 438/600 |
| 5,656,534 A | * | 8/1997 | Chen et al. ..................... 438/600 |
| 5,670,403 A | | 9/1997 | Chen |
| 5,856,233 A | * | 1/1999 | Bryant et al. ................. 438/600 |
| 5,886,392 A | | 3/1999 | Schuegraf |
| 5,945,840 A | | 8/1999 | Cowles et al. |
| 6,124,194 A | * | 9/2000 | Shao et al. .................... 438/600 |
| 6,165,851 A | * | 12/2000 | Satoh ............................ 438/275 |

* cited by examiner

Primary Examiner—Tuan H. Nguyen
(74) Attorney, Agent, or Firm—Stanton Braden

(57) ABSTRACT

A manufacturing process for producing dynamic random access memories (DRAMs) having redundant components includes steps for concurrently forming normal (i.e. non-fused) contacts to components of the DRAMs and anti-fused contacts to the redundant components. The process by which the normal and anti-fused contacts are made is readily implemented using standard integrated circuit processing techniques. An anti-fuse contact (20) and a normal (i.e. non-fused) contact (10) are formed by opening respective contact areas in a dielectric (110), selectively forming an insulating layer (210) over the anti-fuse contact, applying polysilicon (212, 410) to cover the insulating layer of the anti-fuse contact and to fill the opening over the normal contact. In one embodiment of the invention, the circuit region served by the anti-fuse contact is subject to ion implantation (810) to improve its conductivity before the anti-fuse contact is formed. In another embodiment of the invention, the anti-fuse is formed in an isolated well (1212) on the integrated circuit device and a non-fused contact (1216) to the well is also provided to aid in blowing the anti-fuse.

19 Claims, 6 Drawing Sheets

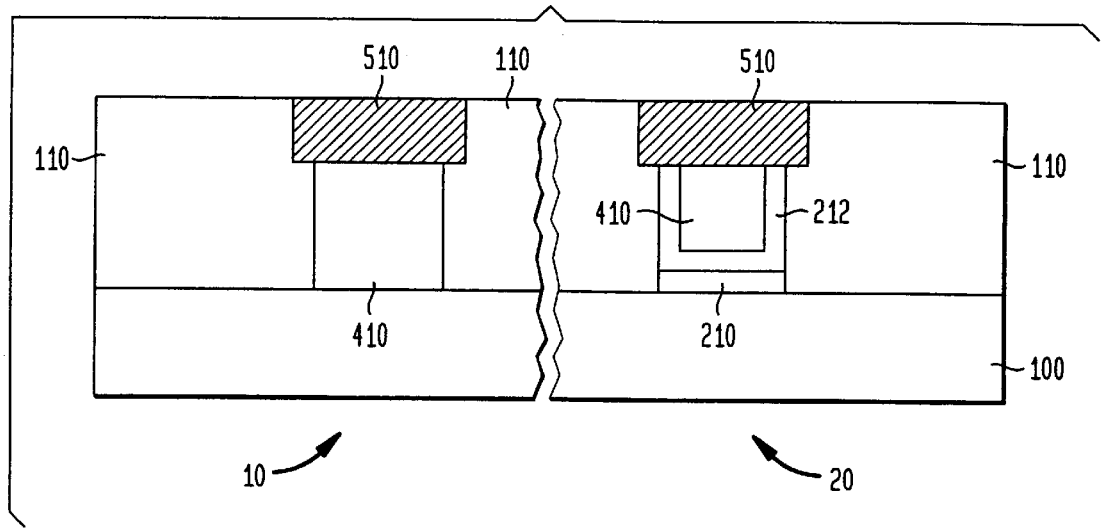
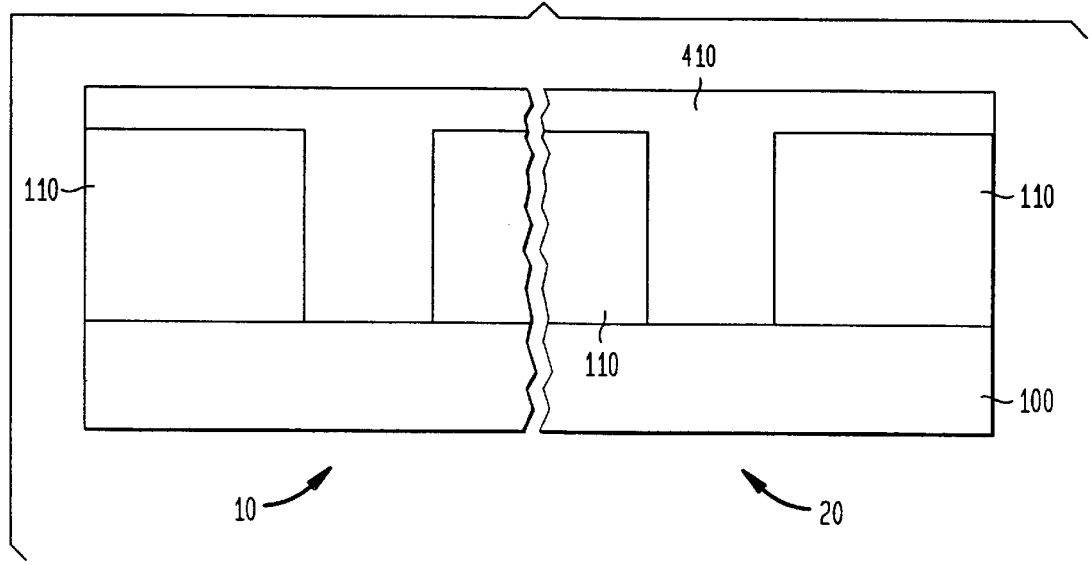

METHOD FOR MAKING AN ANTI-FUSE

BACKGROUND OF THE INVENTION

The present invention relates to semiconductor devices and in particular to anti-fuse elements formed in integrated circuit devices.

Redundancies are commonly used in the manufacture of dynamic random access memories (DRAMs) to increase yields. DRAM devices are designed with a number of redundant component elements such that if, on testing, one component is found to be defective, one of the redundant components may be substituted for the defective component to provide a fully functional circuit. These redundant components may be individual memory rows, memory columns or even individual bit positions in the memory.

Once the DRAM devices are fully assembled, two types of fuse elements may be used to isolate the defective component and connect the redundant component: a conventional fuse element which is closed until it is opened at a wafer level using a laser to cut though the fuse element, and an anti-fuse element which is open until it is shorted out in response to an electric current. When a defective component is identified in the integrated circuit, it may be removed from the circuit and replaced by a redundant component by cutting conventional fuses. Next, the redundant component may be substituted into the circuitry by blowing anti-fuses in order to selectively connect the redundant component in place of the defective component. This process is known as "repairing" the device. While laser-trimmed fuse elements may be used to repair devices at the wafer level, electrically blown fuses may be used to repair devices after they are packaged. Generally, it is difficult to use electrically blown fuse elements as it is difficult to provide the high voltages and currents needed to blow the fuses once the device has been packaged. Antifuse elements, however, are typically blown using relatively low voltages and currents that can easily be provided to the packaged circuit.

The formation of a fuse element is relatively straightforward, a thin layer of metal is applied in a pattern that defines trace having first and second ends separated by a relatively narrow waist. A higher than normal current is then applied to the conductive trace. This current, flowing through the relatively narrow waist heats the metallization and causes it to melt, disconnecting the two ends of the trace. More commonly, however, a laser is used to cut through the metal trace on the wafer level, after the device has been tested.

Anti-fuses, on the other hand, are relatively more complex to manufacture. These devices are formed as a part of the process by which the integrated circuit is produced. One such anti-fuse circuit is described in U.S. Pat. No. 5,886,392 entitled ONE TIME PROGRAMMABLE ELEMENT TABBING CONTROLLED PROGRAMMED STATE RESISTANCE. The anti-fuse described in this patent is formed by depositing a first metal layer, depositing an insulating layer on top of the first metal layer and then depositing a second metal layer on top of the first metal layer. In addition, the semiconductor device is processed to define locations at which the anti-fuses are placed, to trim the metallization to prevent inadvertent short circuits from developing and to provide electrical connection to both ends of the anti-fuse device. At least some of the processing steps used to form the anti-fuse device (i.e. the two metallization steps) may be difficult to integrate into a typical DRAM manufacturing process.

SUMMARY OF THE INVENTION

The present invention is embodied in a DRAM manufacturing process that is more readily implemented using standard integrated circuit processing techniques. An anti-fuse contact and a normal (i.e. non-fused) contact are formed by opening respective contact areas in a dielectric, selectively forming an insulating layer over the anti-fuse contact applying polysilicon to cover the insulating layer of the anti-fuse contact and filling the opening over the normal contact.

According to one aspect of the invention, ion implantation is used to increase the conductivity of the contact area of the anti-fuse contact before the insulating layer is formed.

According to yet another aspect of the invention, the anti-fuse is formed in an isolated well on the integrated circuit device and a non-fused contact to the well is also provided to aid in blowing the anti-fuse.

BRIEF DESCRIPTION OF THE DRAWINGS

The invention is best understood from the following detailed description when read in connection with the accompanying drawing. It is emphasized that according to common practice, the various features of the drawings are not to scale. On the contrary, the dimensions of the various features are arbitrarily expanded or reduced for clarity and to aid in the description of the invention. Included in the drawings are the following figures.

FIGS. 2 through 5 are cross-sectional diagrams of the integrated circuit shown in FIG. 1 which illustrate the formation of the anti-fuse and array contact.

FIGS. 6 through 11 are cross-sectional diagrams of the integrated circuit device shown in FIG. 1 which illustrate an alternative method for forming an array contact and an anti-fuse device.

DETAILED DESCRIPTION

The present invention is embodied in a semiconductor process by which anti-fuse contacts to redundant integrated circuit elements may be made at the same time as normal contacts. FIGS. 1 through 11 are cutaway views of a semi-conductor element showing two sections. Section 10 corresponds to a normal contact in the integrated circuit while Section 20 corresponds to an anti-fuse contact.

While the invention is described in terms of bit-line contacts for a DRAM device, it is contemplated that it may be used for other types of integrated circuits where it is desirable to concurrently form both normal contacts anti-fuse contacts.

In the exemplary embodiment of the invention, both a normal contact and an anti-fuse contact are formed to provide a bit-line contact to a pass transistor on the integrated circuit. The bit-line contact (not shown) is in the semi-conductor substrate 100. In the first step of the process, an insulating layer of, for example, silicon oxide 110 is deposited on the substrate 100. Next, a photo resist material 112 is patterned onto the insulating layer 110 and standard dry etch techniques are used to form openings in the insulating layer of 110 down to the bit-line contacts on the substrate 100.

Figure 1:
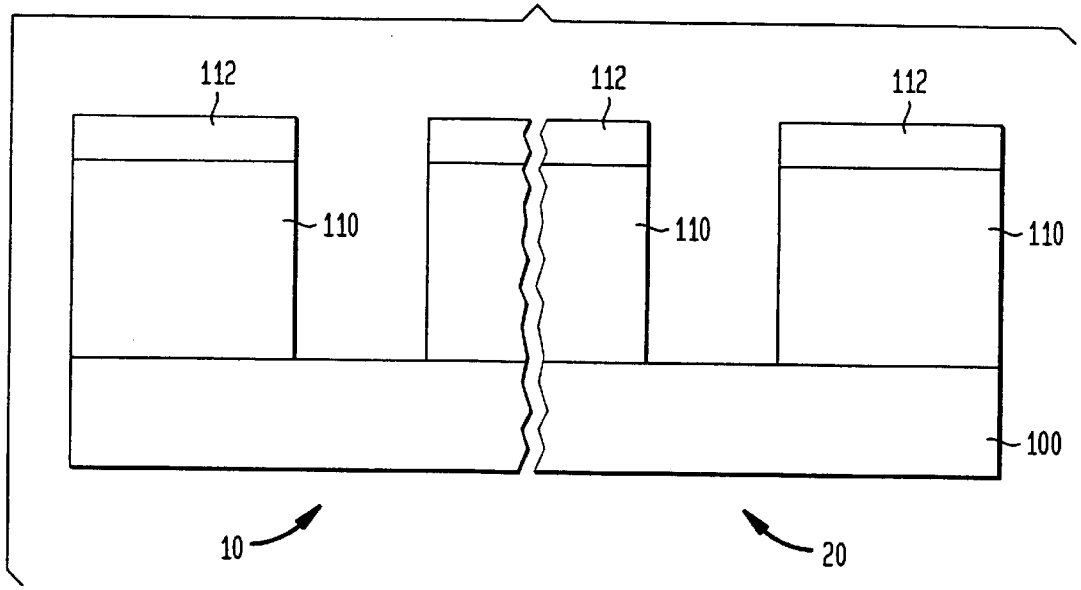
FIG. 1 is a cross-section of an integrated circuit device in which channels have been opened for an array contact and an anti-fuse.
Figure 2:
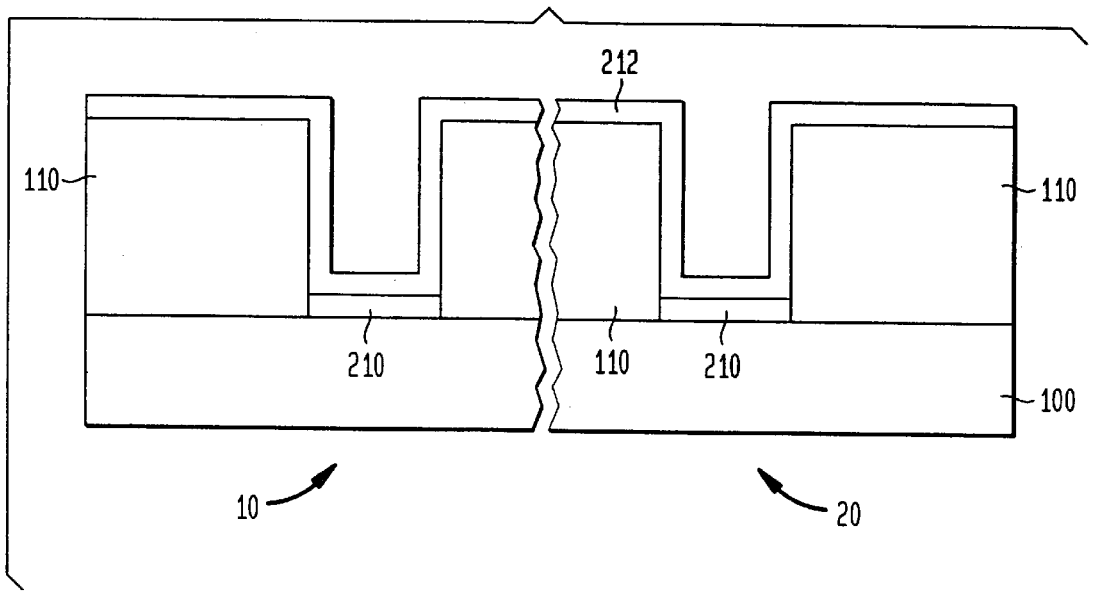

Next, as shown in FIG. 2, a thin insulating layer 210 is grown or deposited in at least the contact regions. The insulating layer may be deposited over the entire surface of the silicon wafer or it may be "grown" by oxidizing the exposed silicon in the regions 10 and 20. The insulating layer 210 may be, for example, a 2 to 5 nm silicon oxide layer grown, for example, using a rapid thermal processing (RTP) tool. Alternatively, the insulating layer may be silicon nitride or other insulating material that is either grown or deposited into the contact areas.

After forming the insulating layer 210, a thin layer of doped polysilicon is deposited over at least the array contact areas of the silicon wafer. In the exemplary embodiment of the invention the polysilicon is N+ doped and has a thickness of 50 to 100 nm. Both the insulating layer and the polysilicon layer may be formed in a single furnace cycle.

Figure 3:
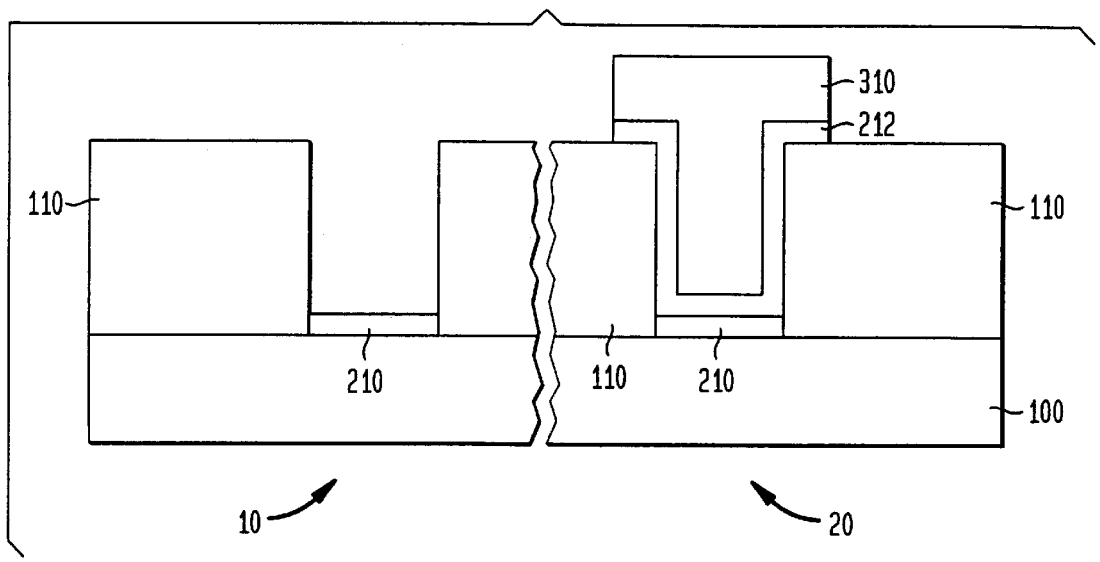

The next step in the process is shown in FIG. 3. In this step, a photo resist pattern 310 is formed exclusively over the anti-fuse regions. The polysilicon 212 is then etched out of the normal contact region 10, using common dry etching techniques. This step leaves only the oxide 210 in the normal array contact area 10, but leaves the polysilicon 212 and the oxide layer 210 in the anti-fuse contact area 20.

Figure 4:
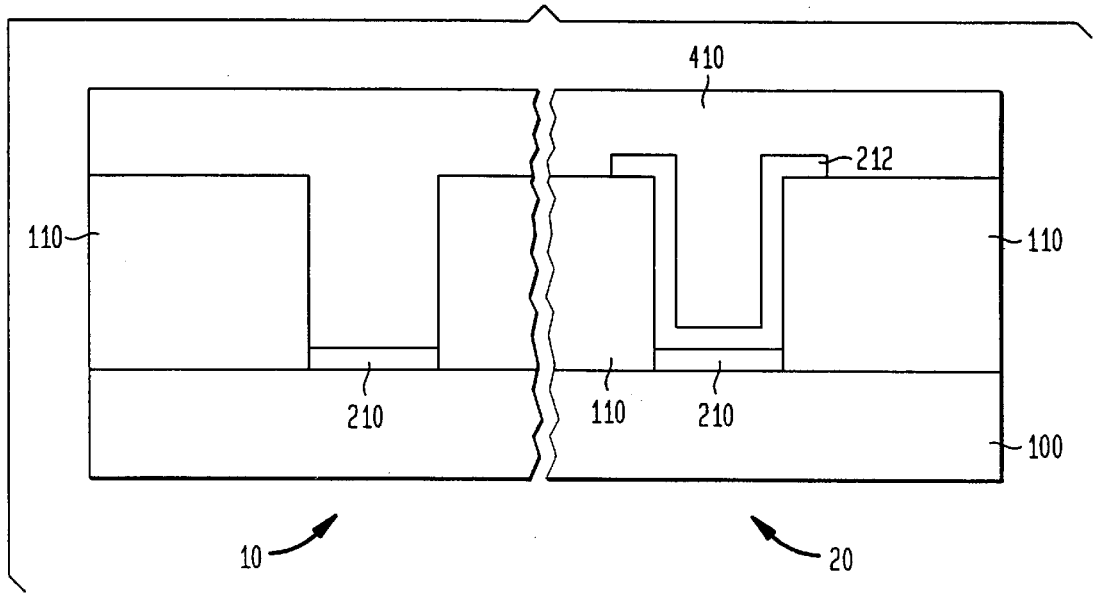

FIG. 4 shows the next steps in the process. As a first step, the resist pattern is stripped from the circuit and the wafers are cleaned using, for example, sulfuric peroxide, ammonium hydroxide peroxide and hydrogen chloride peroxide. Buffered hydrofluoric acid or some similar acid is then used to etch away the thin insulating layer 210 from the normal contact regions. The polysilicon layer 212 protects the oxide in the anti-fuse regions 20 from being removed by the etchant. Next, a thick doped polysilicon layer 410 approximately 300 to 400 nm thick is deposited on the wafer. This fills all of the contact areas. In the exemplary embodiment of the invention the polysilicon layer 410 is N+ doped.

The next steps in the process are shown in FIG. 5. As shown in this figure, a dry etch is used to remove the polysilicon from the surface of the insulator 110 while simultaneously recessing the polysilicon in the contract regions 10 and 20. In the exemplary embodiment of the invention, the polysilicon is recessed to a depth of 200 to 300 nm below the surface of the insulator 110. Also, as shown in FIG. 5, the insulator 110 is patterned to form contact regions and the contact regions are filled with a metallic material 510 (e. g. aluminum).

FIG. 5 shows the completed structure for both a normal bit-line contact 10 and a anti-fuse coupled bit-line contact 20. The normal bit-line contact is formed by a metal layer 510 and polysilicon layer 410 positioned above and in contact with the bit-line pass transistor (not shown) on the substrate 100. The anti-fuse coupled bit-line contact is formed from a metallic layer 510 to polysilicon regions 410 and 210 and a thin insulating layer 210 positioned above the bit-line pass transistor.

Although the process described above deposited doped polysilicon 410 to form the body of the normal contact 10 and the anti-fuse contact 20, it is contemplated that a metallic material (e.g. aluminum) may be deposited in place of the polysilicon 410.

As described below with reference to FIG. 12, the anti-fuse contact my be blown by applying a voltage across the insulating layer 210 by applying a potential to the metallic layer 510 and to the bit-line contact area using one or more normal contacts which directly connect to the bit-line contact area.

Using this technique, the inventors have been able to produce anti-fuses having blown resistances of between 10 kilohms and 100 kilohms with unblown resistances of one megohm.

For some applications, it may be desirable to enhance the bit contact region through ion implantation techniques prior to forming the fuse regions. The implanted region acts to reduce the contact resistance of the fuse. It may also be desirable to block any implant from other array regions to prevent the alteration of transistors in those regions. These steps my be performed without adding additional mask levels as described below with reference to figures six through eleven.

As shown in FIG. 6, the contact areas 10 and 20 are opened in the insulating layer 110 using common photolithography and dry etch techniques. A thick doped polysilicon layer, 300 to 500 nm thick, is then deposited over the entire surface of the insulating layer 110. This polysilicon layer fills both the normal bit-line contacts and the anti-fuse contacts.

Figure 7:
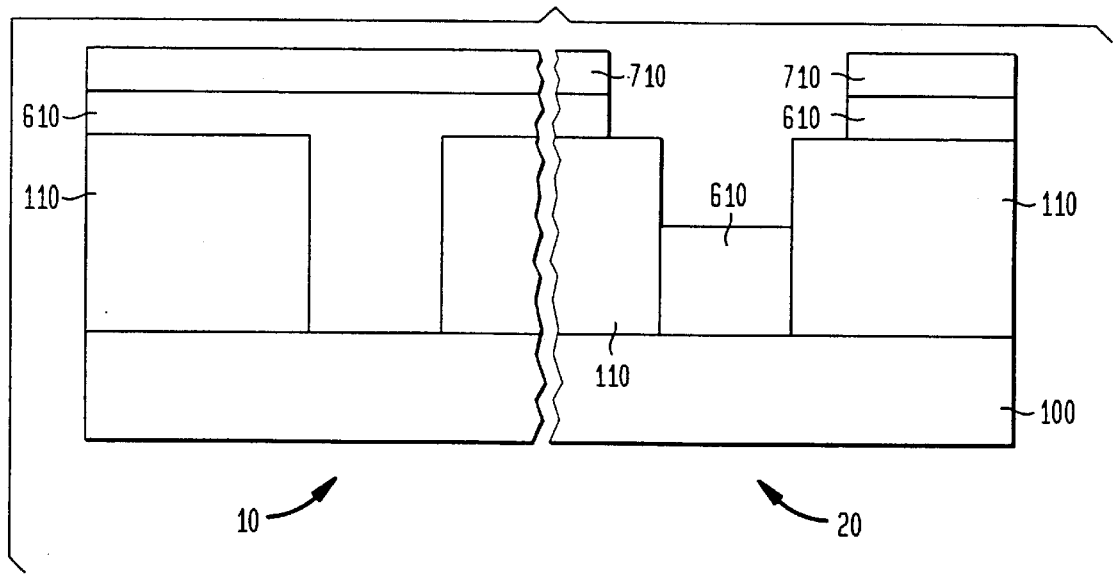

As shown in FIG. 7, a photo resist pattern 710 is then formed over the surface of the polysilicon 610 to provide openings in the photo resist over the anti-fuse areas 20. The polysilicon in the anti-fuse areas 20 is then etched down to leave approximately 200 to 400 nm of polysilicon in the anti-fuse areas 20. All of the steps as shown in FIGS. 6 and 7 may be performed in a single multi-step dry etch process.

Figure 8:
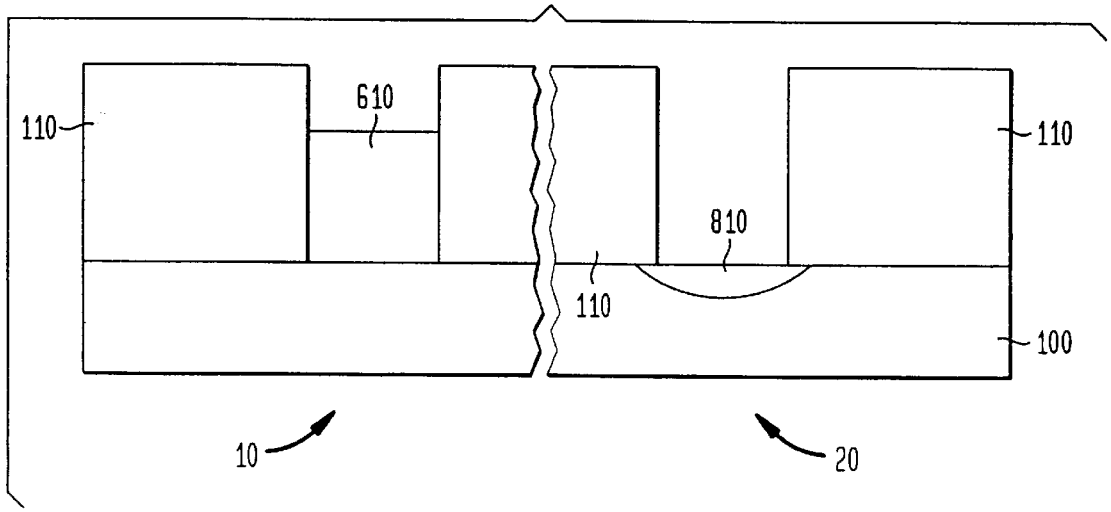

Next, as shown in FIG. 8, the remaining photo resist is stripped and the wafer is etched to remove all of the polysilicon from the anti-fuse areas 20 and to recess the polysilicon in the normal contact regions 10 to approximately 100 to 300 nm below the surface of the insulating layer 110. The etchant chosen for this process desirably etches the polysilcon at a faster rate than single crystalline silicon so as not to etch too deeply into the substrate 100 near the fuse contact region 20. The fuse regions are then implanted with a selected dopant. In the exemplary embodiment of the invention, the dopant is phosphorus or arsenic and is implanted in a concentration of $10^{14}$ atoms per square centimeter using a 30 Kev implantation process.

Figure 9:
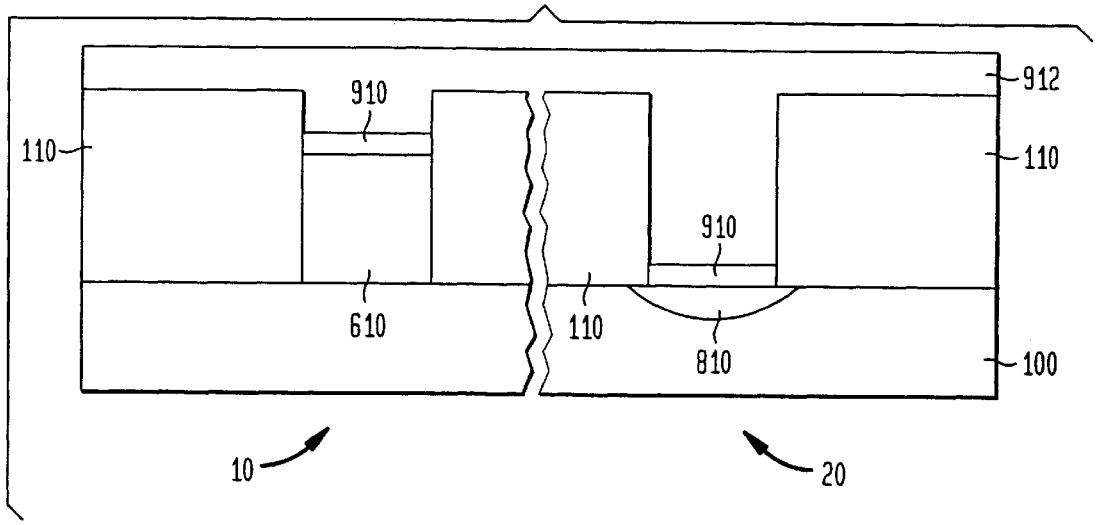

As shown in FIG. 9, the next step in the process is to grow a thin (e.g. 2 to 5 nm) fuse oxide layer 910 over the polysilicon 610 remaining in the normal contact region 10 as well as the implanted region 810 in the anti-fuse area 20. A second layer of doped polysilicon 912 is then deposited. The polysilicon film 912 is desirably 300 to 500 nm thick and fills both the fuse contact areas and the array contact areas.

Figure 10:
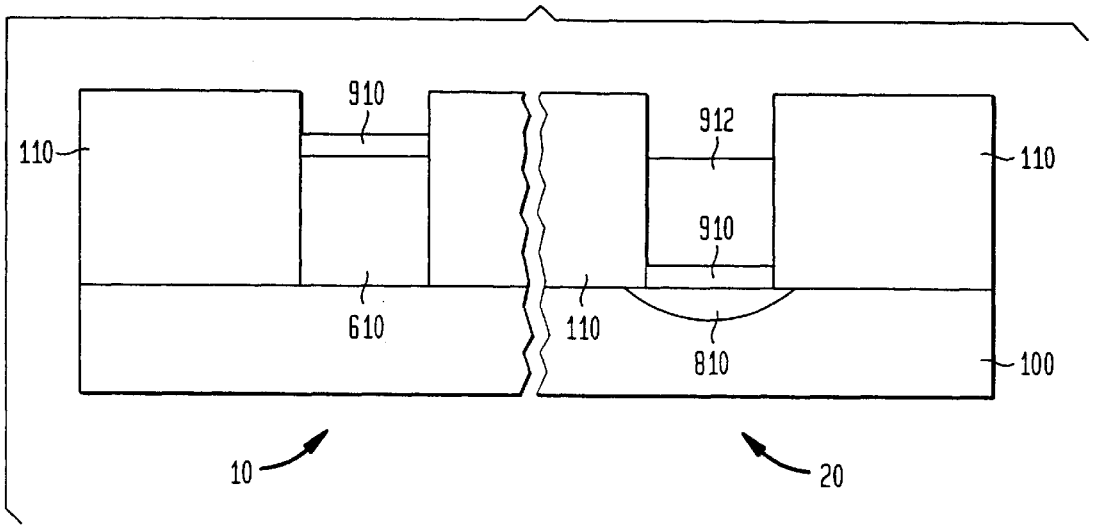

Next, as shown in FIG. 10, the polysilicon layer 912 is recessed using a dry etchant. This etching operation is stopped when the oxide area 910 in the normal contact areas 10 are exposed. This results in a polysilicon layer that is recessed approximately 100 to 300 nm below the surface of the insulating layer 100 in the anti-fuse regions 20.

Figure 11:
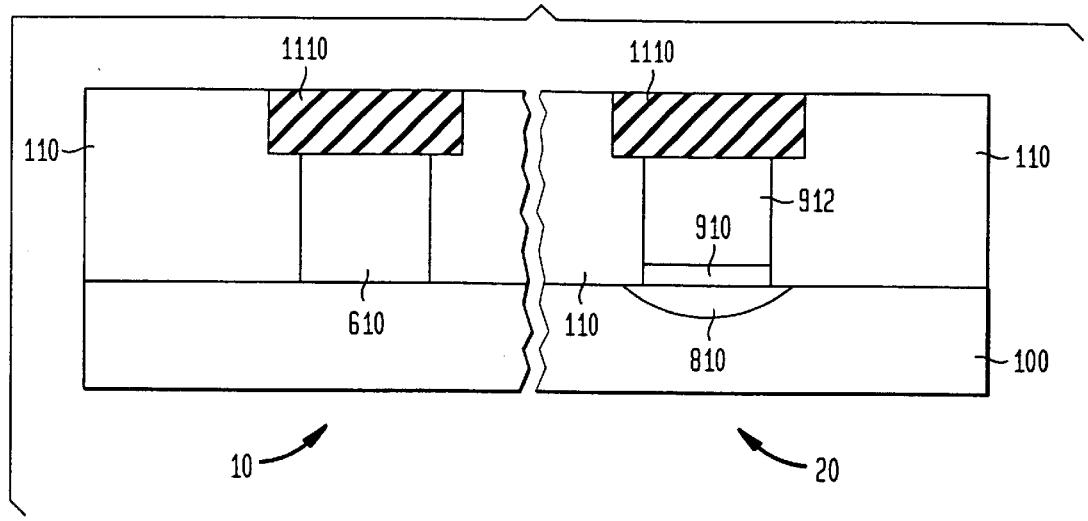

Finally, as shown in FIG. 11, the silicon oxide 910 is removed from the normal contact regions 10 using, for example, buffered hydrogen fluoride. Both the normal contact areas 10 and anti-fuse contact areas 20 are then patterned to form contacts and metallized to deposit a metal layer 1110 (e.g. aluminum) over both the normal contact and the anti-fuse contact areas.

Using the steps described above with reference to FIGS. 6 through 11, both normal contact and anti-fuse contact areas have been formed and the anti-fuse contact regions have been enhanced by implanted region 810 in the bit-line contact area (not shown).

Figure 12:
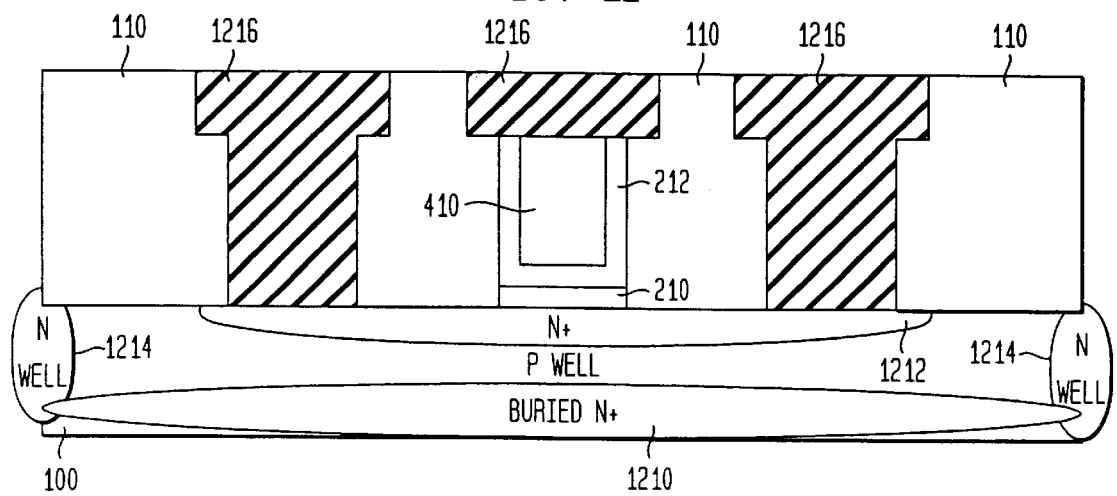
FIG. 12 is a cross-section of a semi-conductor device which illustrates the configuration of the anti-fuse device shown in FIGS. 5 and 11, along with additional circuitry which is used to blow the anti-fuse.

FIG. 12 shows a typical application for the anti-fuse elements described above with reference to FIGS. 1 through 11. The exemplary anti-fuse element includes an insulating layer 210, polysilicon layers 410 and 212, and a metallization layer 1216. As shown in FIG. 12, the anti-fuse is formed above a bit-line region 1212 in a silicon substrate covered by an insulating layer 110. In addition to the anti-fuse area 20, two metallic contact areas 1216 are formed above the bit-line region 1212. The anti-fuse is blown by applying a potential of approximately 5 to 7 volts between the contact area of the anti-fuse 20 and the contact areas of the two metallic contacts 15. A current flowing in response to this potential punches through the insulating layer 210 at the bottom of the anti-fuse region 20, locally heating the area and causing the polysilicon 212 to flow into contact with the N+ contact region 1212.

While the programming contact regions 15 are shown as being metallic contacts, it is contemplated that they may be ordinary non-fused contacts formed in the same process as used to form the normal contact regions 10 as described above with reference to FIGS. 1 through 11.

The anti-fuse contact 20 and the programming contacts 15 are shown in a typical configuration which includes a buried N+ region formed, for example, by a high voltage ion implantation and diffusion process in a P-well 100. The P-well 100 is separated from the remaining circuitry by isolation diffusions 1214 formed, for example, by standard surface deposition and diffusion techniques. The bit-line contact 1212 is formed in the P-well using standard surface deposition and diffusion techniques. In the exemplary embodiment of invention, the P-well 100 is N+ doped using, for example, phosphorous or arsenic as the dopant to form the bit-line contact 1212.

While the invention has been described in terms of an exemplary embodiment, it is contemplated that it may be practiced as described above within the scope of the appended claims.

What is claimed:

1. A method for manufacturing an integrated circuit including a direct connection to a first element of the integrated circuit and an anti-fuse connection to a second element of the integrated circuit comprising the steps of:

forming a first insulating layer over the integrated circuit;

selectively forming openings in the insulating layer above the first and second elements;

forming a second insulating layer at least in the openings above the first and second elements;

selectively forming a layer of doped polysilicon over the second insulating layer in the opening above the second element;

applying an etchant which reacts with and removes the second insulating layer in the opening above the first element but does not remove the polysilicon over the second insulating layer in the opening above the second element;

selectively filling the openings above the first and second elements with a conductive material to form the direct connection and the anti-fuse connection, respectively.

2. A method according to claim 1 wherein the second insulating layer is 2 to 5 nanometers (nm) thick and is formed using a rapid thermal processing tool.

3. A method according to claim 2 wherein the first insulating layer is silicon oxide and the second insulating layer is selected from a group consisting of silicon oxide and silicon nitride.

4. A method according to claim 3 wherein the conductive material is doped polysilicon.

5. A method according to claim 1 wherein the step of selectively forming a layer of doped polysilicon over the second insulating layer in the opening above the second element includes the steps of:

depositing the layer of doped polysilicon over the first and second insulating layers;

selectively covering the opening above the second element with a photomask material;

etching the doped polysilicon layer where it is not covered by the photomask material to expose the second insulating layer in the opening above the first element; and removing the photomask material.

6. A method according to claim 5 wherein the step of forming the second insulating layer and the step of depositing the layer of doped polysilicon over the first and second insulating layers are performed in a single furnace cycle.

7. A method according to claim 1 wherein the step of selectively filling openings above the first and second elements with a conductive material comprises the steps of:

depositing a further layer of doped polysilicon over the surface of the integrated circuit including the openings above the first and second elements;

partially removing the deposited further layer of doped polysilicon from the integrated circuit to remove the polysilicon from the first insulating layer and leave a portion of the further layer of polysilicon in the openings above the first and second elements; and selectively applying a metallic material to the polysilicon in the openings above the first and second elements.

8. A method for manufacturing an integrated circuit including a direct connection to a first element of the integrated circuit and an anti-fuse connection to a second element of the integrated circuit comprising the steps of:

forming a first insulating layer over the integrated circuit;

selectively forming openings in the insulating layer above the first and second elements;

depositing a layer of polysilicon to cover the first insulating layer and to fill the openings above the first and second elements;

covering the deposited layer of polysilicon with a photomask material except for the portions of the layer of polysilicon filling the opening above the second element;

etching the integrated circuit to partially remove the polysilicon filling the opening above the second element;

removing the photomask material;

etching the integrated circuit to remove the polysilicon covering the first insulating layer, to remove the polysilicon filling the opening above the second element and to partially remove the polysilicon filling the opening above the first element;

performing an ion implantation operation on the integrated circuit to form a implanted region in the second element of the integrated circuit and in the polysilicon in the opening above the first element of the integrated circuit;

forming a second insulating layer at least in the openings above the first and second elements;

depositing a layer of doped polysilicon over the second insulating layer in the opening above the first and second elements;

partially removing the deposited layer of doped polysilicon to expose the second insulating layer in the opening above the first element to leave a portion of the deposited layer of doped polysilicon in the opening above the second element;

applying an etchant which reacts with and removes the second insulating layer in the opening above the first element but does not react with the polysilicon over the second insulating layer in the opening above the second element;

selectively filling openings above the first and second elements with a conductive material to form the direct connection and the anti-fuse connection, respectively.

9. A method according to claim 8 wherein the second insulating layer is 2 to 5 nanometers (nm) thick and is formed using a rapid thermal processing tool.

10. A method according to claim 9 wherein the first insulating layer is silicon oxide and the second insulating layer is selected from a group consisting of silicon oxide and silicon nitride.

11. A method according to claim 10 wherein the conductive material is doped polysilicon.

12. A method for manufacturing an integrated circuit including a direct connection to a first element of the integrated circuit and an anti-fuse connection to a second element of the integrated circuit comprising the steps of:

depositing a layer of silicon oxide over the integrated circuit;

forming a photomask on the surface of the layer of silicon oxide with openings in the photomask above the first and second elements;

etching the integrated circuit to selectively remove the layer of silicon oxide covering the first and second elements to form respective first and second openings in the silicon oxide layer;

growing a second insulating layer at least in the openings above the first and second elements;

depositing a layer of doped polysilicon over the integrated circuit to including the openings above the first and second elements;

selectively covering the opening above the second element with a photomask material;

etching the doped polysilicon layer where it is not covered by the photomask material to expose the second insulating layer in the opening above the first element;

removing the photomask material;

applying an etchant which reacts with and removes the second insulating layer in the opening above the first element but does not react with the polysilicon over the second insulating layer in the opening above the second element;

selectively filling openings above the first and second elements with a conductive material to form the direct connection and the anti-fuse connection, respectively.

13. A method according to claim 12 wherein the second insulating layer is 2 to 5 nanometers (nm) thick and is formed using a rapid thermal processing tool.

14. A method according to claim 12 wherein the second insulating layer is selected from a group consisting of silicon oxide and silicon nitride.

15. A method according to claim 12 wherein the conductive material is doped polysilicon.

16. A method for manufacturing an integrated circuit including a direct connection to a first element of the integrated circuit and an anti-fuse connection to a second element of the integrated circuit comprising the steps of:

depositing a layer of silicon oxide over the integrated circuit;

forming a photomask on the surface of the layer of silicon oxide with openings in the photomask above the first and second elements;

etching the integrated circuit to selectively remove the layer of silicon oxide covering the first and second elements to form respective first and second openings in the silicon oxide layer;

depositing a layer of polysilicon to cover the first insulating layer and to fill the openings above the first and second elements;

covering the deposited layer of polysilicon with a photomask material except for the portions of the layer of polysilicon filling the opening above the second element;

etching the integrated circuit to partially remove the polysilicon filling the opening above the second element;

removing the photomask material;

etching the integrated circuit to remove the polysilicon covering the first insulating layer, to remove the polysilicon filling the opening above the second element and to partially remove the polysilicon filling the opening above the first element;

performing an ion implantation operation on the integrated circuit to form a implanted region in the second element of the integrated circuit and in the polysilicon in the opening above the first element of the integrated circuit;

growing a second insulating layer at least in the openings above the first and second elements;

depositing a layer of doped polysilicon over the second insulating layer in the opening above the first and second elements;

partially removing the deposited layer of doped polysilicon to expose the second insulating layer in the opening above the first element to leave a portion of the deposited layer of doped polysilicon in the opening above the second element;

applying an etchant which reacts with and removes the second insulating layer in the opening above the first element but does not react with the polysilicon over the second insulating layer in the opening above the second element;

selectively filling openings above the first and second elements with a conductive material to form the direct connection and the anti-fuse connection, respectively.

17. A method according to claim 16 wherein the second insulating layer is 2 to 5 nanometers (nm) thick and is formed using a rapid thermal processing tool.

18. A method according to claim 16 wherein the second insulating layer is selected from a group consisting of silicon oxide and silicon nitride.

19. A method according to claim 16 wherein the conductive material is doped polysilicon.

* * * * *